United States Patent
Yamashita et al.

(10) Patent No.: US 11,152,782 B2
(45) Date of Patent: Oct. 19, 2021

(54) DRIVE DEVICE

(71) Applicant: AISIN AW CO., LTD., Anjo (JP)

(72) Inventors: Kento Yamashita, Nishio (JP); Junichi Kawasaki, Tokoname (JP)

(73) Assignee: AISIN AW CO., LTD., Anjo (JP)

( * ) Notice: Subject to any disclaimer, the term of this patent is extended or adjusted under 35 U.S.C. 154(b) by 814 days.

(21) Appl. No.: 15/745,893

(22) PCT Filed: Sep. 30, 2016

(86) PCT No.: PCT/JP2016/079030
§ 371 (c)(1),
(2) Date: Jan. 18, 2018

(87) PCT Pub. No.: WO2017/057682
PCT Pub. Date: Apr. 6, 2017

(65) Prior Publication Data
US 2018/0212419 A1 Jul. 26, 2018

(30) Foreign Application Priority Data

Sep. 30, 2015 (JP) .............................. JP2015-194353

(51) Int. Cl.
*H02H 7/20* (2006.01)
*H02P 29/024* (2016.01)
(Continued)

(52) U.S. Cl.
CPC ............. *H02H 7/20* (2013.01); *B60R 16/005* (2013.01); *H02H 1/0007* (2013.01); *H02H 7/08* (2013.01);
(Continued)

(58) Field of Classification Search
CPC ........ H02P 15/00; H02P 15/02; H02P 29/024; H02P 29/0241; H02P 25/032; H02P 25/034; H02H 7/0844; H02H 7/09; H02H 7/20
See application file for complete search history.

(56) References Cited

U.S. PATENT DOCUMENTS

2002/0105239 A1* 8/2002 Witzig .................. H02K 11/20
310/68 B
2006/0238950 A1 10/2006 Sunaga et al.
(Continued)

FOREIGN PATENT DOCUMENTS

JP 2002-084175 A 3/2002
JP 2006-203415 A 8/2006
(Continued)

OTHER PUBLICATIONS

International Search Report for PCT/JP2016/079030 dated Dec. 20, 2016.

*Primary Examiner* — Jared Fureman
*Assistant Examiner* — Christopher J Clark
(74) *Attorney, Agent, or Firm* — Sughrue Mion, PLLC

(57) ABSTRACT

A drive device (9) drivably controls linear solenoid valves (SL1 to SL5) by inputting respective drive signals to one-side ends (5a) of the linear solenoid valves (SL1 to SL5) via a connector (Co) and wires (Ha). Other-side ends (5b) of the linear solenoid valves (SL1 to SL5) are connected to respective wires (56). The wires (56) are connected to the connector (Co) while being integrally commonalized by the common wire (57). This allows reducing the number of ground terminals gt of the connector (Co), whereby the connector (Co) can be downsized.

12 Claims, 6 Drawing Sheets

(51) Int. Cl.

| | | |
|---|---|---|
| *H02P 25/034* | (2016.01) | |
| *H02H 7/08* | (2006.01) | |
| *H02H 7/09* | (2006.01) | |
| *B60R 16/00* | (2006.01) | |
| *H02H 1/00* | (2006.01) | |
| H02P 5/68 | (2006.01) | |
| H03K 17/687 | (2006.01) | |

(52) U.S. Cl.
CPC ........ *H02P 25/034* (2016.02); *H02P 29/0241* (2016.02); *H02H 7/09* (2013.01); *H02P 5/68* (2013.01); *H03K 17/687* (2013.01)

(56) References Cited

U.S. PATENT DOCUMENTS

| | | |
|---|---|---|
| 2008/0218103 A1 | 9/2008 | Nakamura |
| 2010/0063667 A1 | 3/2010 | Ebara et al. |
| 2011/0018362 A1 | 1/2011 | Jaeckle |

FOREIGN PATENT DOCUMENTS

| | | |
|---|---|---|
| JP | 2006-303992 A | 11/2006 |
| JP | 2008-128458 A | 6/2008 |
| JP | 2008-253122 A | 10/2008 |
| JP | 2011-023802 A | 2/2011 |
| JP | 2011-515935 A | 5/2011 |
| JP | 2012-085038 A | 4/2012 |

\* cited by examiner

DRIVE DEVICE

CROSS REFERENCE TO RELATED APPLICATIONS

This application is a National Stage of International Application No. PCT/JP2016/079030 filed Sep. 30, 2016, claiming priority based on Japanese Patent Application No. 2015-194353 filed Sep. 30, 2015, the contents of all of which are incorporated herein by reference in their entirety.

TECHNICAL FIELD

This technology relates to a drive device to be connected to an inductive load such as a solenoid valve that is drivably controlled.

BACKGROUND ART

Hitherto, a mechanism that performs shifting by switching excitation and non-excitation of a solenoid valve and therefore switching a hydraulic circuit is used for shifting control of a vehicle automatic transmission. In this technology, highly accurate current control is required on the solenoid valve for shifting in order to reduce a shift shock. As a control device that controls an inductive load such as the solenoid valve, there is known a control device that performs current feedback control that involves detecting a current flowing through the inductive load in the form of a voltage across both ends of a current detecting resistor connected to an energization path of the inductive load, and adjusting, based on the detected voltage, an on/off duty ratio of an energization switching element so that the current flowing through the inductive load has a control target value (see Patent Literature 1).

CITATION LIST

Patent Literature

Patent Literature 1: Japanese Patent Application Publication No. 2002-84175 (JP 2002-84175 A)

SUMMARY OF THE APPLICATION

Problem to be Solved by the Various Embodiments

When the end of a coil of the inductive load is frame-grounded to a valve body side, the ground resistance value increases, and the operating voltage range of the inductive load may be narrowed. Therefore, the control device described in Patent Literature 1 uses two wires, which are a wire for supplying a current to one inductive load, and a wire connected to the ground. In recent years, however, multi-speed automatic transmissions have been developed in the field of automatic transmissions. Along with the development, the number of necessary inductive loads (solenoid valves) increases. Therefore, the number of necessary wires increases, and the number of terminals of a connector that connects the wires to the control device also increases. Thus, a problem arises in that the size of the connector increases.

It is therefore an aspect to provide a drive device in which a connection portion can be downsized.

Means for Solving the Problem

A drive device according to the present disclosure controls a plurality of inductive loads each having a one-side end and an other-side end, is drivably controlled in accordance with an input of a drive signal, and is connected at the other-side end to one terminal out of a positive terminal and a negative terminal of a battery.

The drive device includes a connection portion that connects a plurality of wires each connected to the one-side end of a corresponding one of the plurality of inductive loads, and a common wire that integrally commonalizes two or more of a plurality of wires each connected to the other-side end of a corresponding one of the plurality of inductive loads.

Thus, the drive device is structured such that the plurality of wires each connected to the other-side end of the corresponding one of the plurality of inductive loads are connected to the connection portion by the common wire that integrally commonalizes two or more of the wires. This allows reducing the number of terminals of the connection portion, whereby the connection portion can be downsized.

PREFERRED EMBODIMENTS

First Embodiment

A first embodiment is described below with reference to FIG. 1 to FIG. 4 and FIG. 6. Note that a linear solenoid valve is used as an inductive load that is drivably controlled by a drive device 9 according to this embodiment.

[Automatic Transmission]

Figure 6:
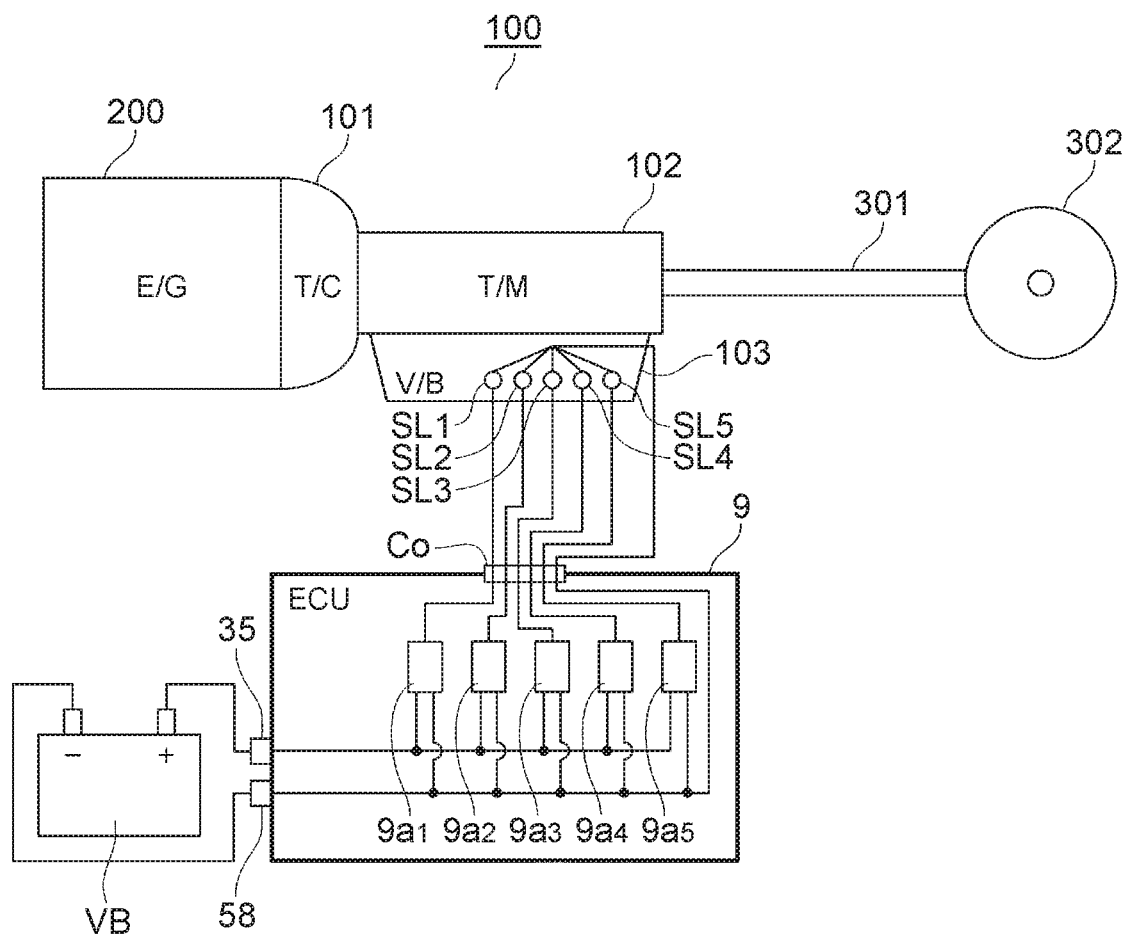
FIG. 6 is a block diagram illustrating an automatic transmission and the drive device according to the embodiments.

First, the schematic structures of the drive device 9 and an automatic transmission 100 according to this embodiment are described. As illustrated in FIG. 6, the automatic transmission 100 is structured by including a torque converter (fluid transmission device) 101 drivably coupled to an engine (drive source) 200, a speed change mechanism 102 that changes the speed of rotation output from the torque converter 101 to output the rotation to a wheel 302 via a propeller shaft 301, a hydraulic control device 103 that hydraulically controls, for example, a circulating hydraulic pressure of the torque converter 101, an operating hydraulic pressure to be supplied to a hydraulic servo system for friction engagement elements (clutches and brakes) (not illustrated) of the speed change mechanism 102, and a lubricating hydraulic pressure for supplying lubricating oil to the speed change mechanism 102, and the drive device (ECU) 9 described later in detail. For example, five linear solenoid valves SL1 to SL5 that hydraulically control, for example, an engagement pressure of the hydraulic servo system for the friction engagement elements are arranged so as to be built in the hydraulic control device 103. FIG. 6 illustrates the drive device 9 at a position spaced away from the automatic transmission 100. The drive device 9 is actually arranged so as to be fixed adjacent to the side or top of the automatic transmission 100, or is arranged so as to be built in the automatic transmission 100. As a matter of course, the drive device 9 may be arranged, for example, in a housing box of an electronic device inside a hood (not illustrated).

[Drive Device]

Figure 1:
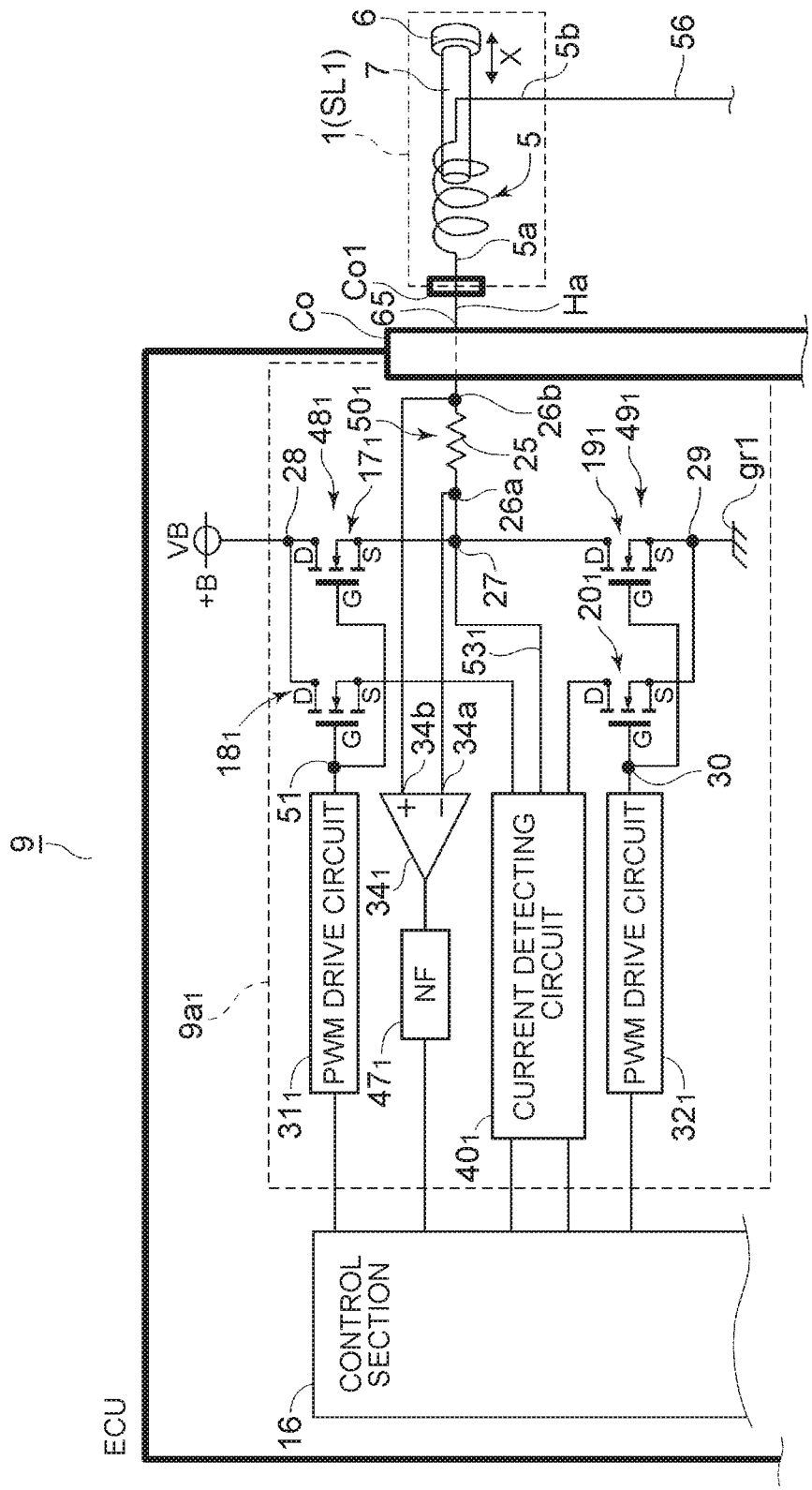
FIG. 1 is a structural diagram illustrating a drive device according to a first embodiment and a linear solenoid valve to which the drive device is connected.
Figure 2:
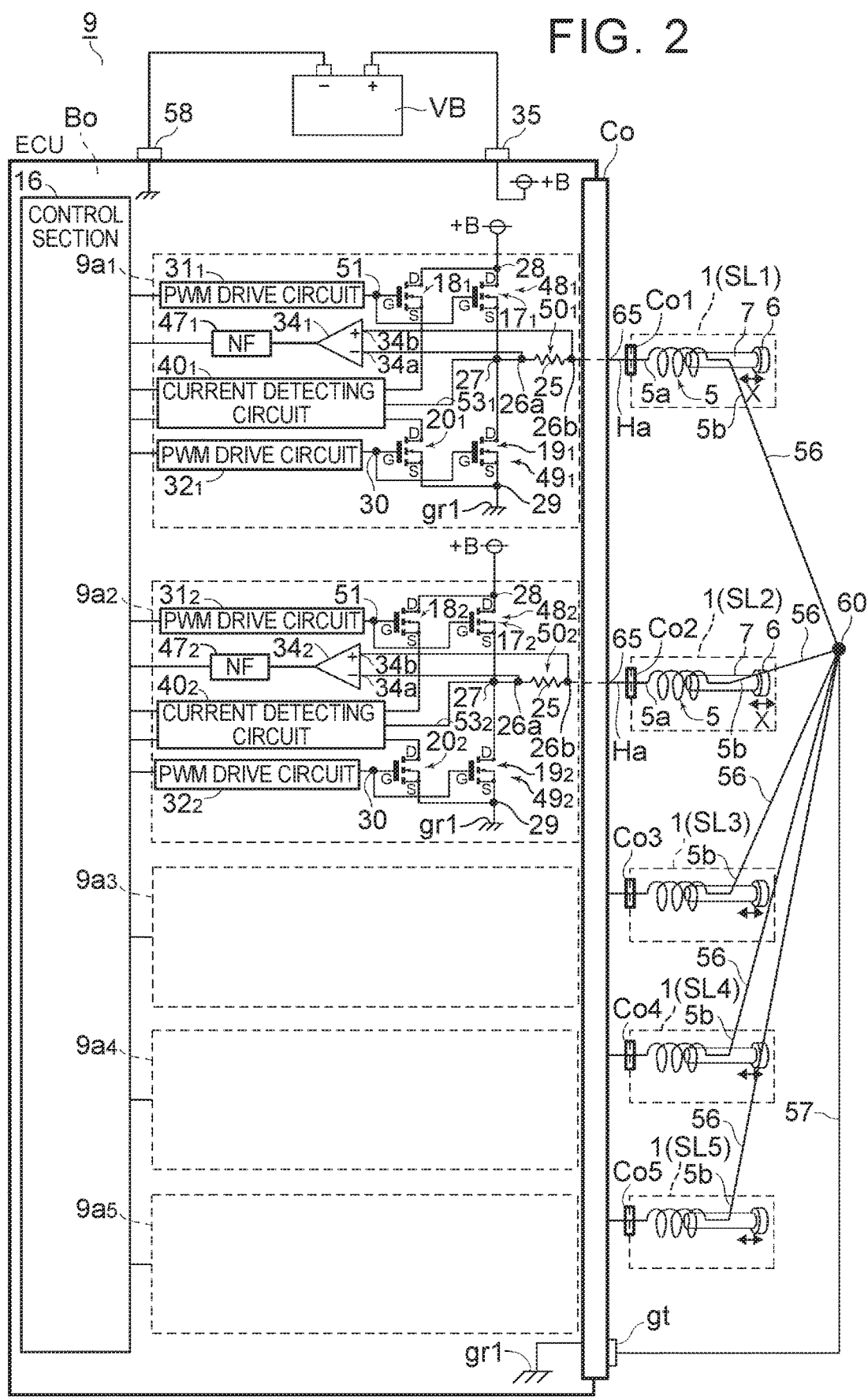
FIG. 2 is an overall circuit diagram illustrating the drive device.

Next, the drive device 9 according to this embodiment and its related components are described with reference to FIG. 1 and FIG. 2. FIG. 1 is a structural diagram illustrating, in a view partially selected from the structure of FIG. 2, the drive device and the linear solenoid valve to which the drive device is connected. FIG. 2 is an overall structural diagram illustrating the drive device. In FIG. 2, control drive sections other than a control drive section $9a_1$ corresponding to the linear solenoid valve SL1 and a control drive section $9a_2$ corresponding to the linear solenoid valve SL2 are drawn as outlined control drive sections $9a_3$ to $9a_5$ in which their illustrations are omitted for convenience. The control drive sections $9a_3$ to $9a_5$ have structures similar to those of the control drive sections $9a_1$ and $9a_2$.

Note that the control drive sections $9a_1$ to $9a_5$ have substantially the same structures despite a difference in that the control drive sections $9a_1$ to $9a_5$ are used for linear solenoid valves having different functions. Therefore, unless the distinction is required, the control drive sections $9a_1$ to $9a_5$ may hereinafter be described collectively by omitting the suffixes 1, 2, and the like that are assigned to the reference symbols of components provided in the control drive sections $9a_1$ to $9a_5$. Furthermore, the components that are arranged in the outlined control drive sections $9a_3$ to $9a_5$ and are similar to those of the control drive sections $9a_1$ and $9a_2$ are not illustrated but, if necessary for description, may be described by adding the suffixes 1, 2, and the like to the tails of the reference symbols that represent the components similar to those of the control drive sections $9a_1$ and $9a_2$.

In this embodiment, the drive device 9 structured by an electronic control unit (ECU) is provided to the automatic transmission (not illustrated) that is suited to use for a vehicle. In FIG. 2, the drive device (ECU) 9 is connected to an upstream side of each of the linear solenoid valves SL1 to SL5 in a direction in which a drive signal (current signal) is supplied. Each of the linear solenoid valves SL1 to SL5 serves as an inductive load that is drivably controlled in accordance with an input of the drive signal to a coil 5.

The drive device 9 includes a control section 16 including a CPU, a RAM, and a ROM, and the control drive sections $9a_1$ to $9a_5$ that are connected to the control section 16 and correspond to the linear solenoid valves (inductive loads) SL1 to SL5, respectively. In this embodiment, linear solenoid valves that can be driven by the control drive sections $9a_1$ to $9a_5$ are described as the five linear solenoid valves SL1 to SL5, but the number of linear solenoid valves is not limited to five, and may be two to four or six or more.

In FIG. 2, a connector Co that is an example of a connection portion is arranged on one side of a substrate Bo on which the drive device (ECU) 9 is provided. The connector Co has connection terminals 65 that interconnect wires Ha connected to connectors Co1, Co2, Co3, Co4, and Co5 provided to the linear solenoid valves SL1 to SL5, respectively. The connectors Co1 to Co5 attached to the wires Ha are connected to terminals (not illustrated) provided in solenoid portions 1 of the linear solenoid valves SL1 to SL5 that are described later.

A connector 35 to which a positive terminal (+) side of a battery VB is connected is arranged on the substrate Bo on which the drive device 9 is provided. The connector 35 connected to the control drive section $9a_1$ connects the positive terminal (+) side of the battery VB to connection nodes 28 of the control drive sections $9a_2$ to $9a_5$ via a wire (see FIG. 6) provided on the substrate Bo. Furthermore, a connector 58 to which a negative terminal (−) side of the battery VB is connected is arranged on the substrate Bo. A ground gr1 of the control drive section $9a_1$ connects the negative terminal (−) side of the battery VB to connection nodes 29 of the control drive sections $9a_2$ to $9a_5$ via a wire (see FIG. 6) provided on the substrate Bo.

In a state in which the linear solenoid valves SL1 to SL5 connected to the connector Co of the drive device 9 as described above are provided in the hydraulic control device 103, one-side ends 5a and opposite other-side ends 5b of the respective coils 5 are integrated by a single common wire 57 at a connection portion 60 via five wires 56. In this state, the linear solenoid valves SL1 to SL5 are connected to a ground terminal gt of the connector Co of the drive device 9 via the common wire 57. That is, the linear solenoid valves SL1 to SL5 are connected to the ground gr1 and the negative terminal (−) of the battery VB.

In general, a ground portion of the coil 5 to be frame-grounded is connected to the negative terminal side of the battery VB via a valve body (not illustrated), a vehicle frame (not illustrated), and the like, and therefore has a resistance value slightly, so that the potential is not 0 [V]. Thus, even when the linear solenoid valve is grounded to the valve body, the operating voltage range may be narrowed because the ground resistance value is relatively high.

In the drive device 9, the common wire 57 is connected to the ground terminal gt in a state in which the other-side ends 5b of the coils of the linear solenoid valves SL1 to SL5 are integrated by the common wire 57 via the wires 56. The ground terminal gt is connected to the negative terminal (−) of the battery VB from the connector 58 via a wire (not illustrated) provided on the substrate Bo. All the grounds gr1 of the control drive sections $9a_1$ to $9a_5$ are also connected to the negative terminal (−) of the battery VB via a wire (not illustrated).

As described above, this embodiment is structured such that all the other-side ends 5b of the coils 5 of the linear solenoid valves are connected to the ground terminal gt while being integrated by the single common wire 57. Accordingly, the operating voltage range can be obtained sufficiently. The reason is as follows. As illustrated in FIG. 2, the ground terminal gt of the drive device 9 is connected to the negative terminal side of the battery VB only via the wire formed of a ground conductor patterned on the substrate Bo without intervention of the valve body, the vehicle frame, and the like. Therefore, the resistance value is infinitesimally low, so that the potential is close to 0 V.

Note that disconnection (OPEN) described later in this embodiment is assumed to be a case where the common wire 57 itself that integrates the wires 56 is disconnected instead of a case where any one of the wires Ha and the connectors Co1 to Co5 is detached from the connector Co or the wires Ha and the wires 56 themselves are disconnected. This embodiment is directed to the case where the five wires 56 are integrated by the single common wire, but two or more wires 56 may be integrated by the single common wire. In other words, for example, two wires 56 may be integrated by a first common wire, and the remaining three wires 56 may be integrated by a second common wire.

Next, detailed structures of the linear solenoid valve SL1 illustrated in FIG. 2 and the control drive section $9a_1$ corresponding to the linear solenoid valve SL1 are described with reference to FIG. 1. The linear solenoid valve SL1 is herein described, and description of the other linear solenoid valves SL2 to SL5 is omitted because the linear solenoid valves SL2 to SL5 have structures similar to that of the linear solenoid valve SL1.

That is, as illustrated in FIG. 1, the linear solenoid valve SL1 arrangeable in the hydraulic control device described above (not illustrated) is connected to the corresponding control drive section $9a_1$ via the wire Ha connected to the connector Co1 and via the connector Co. The other-side end $5b$ of the coil 5 of the linear solenoid valve SL1 is connected via the wire 56 and the common wire 57 to the low-resistance ground gr1 that is brought into conduction to the ground terminal gt described above. The linear solenoid valve SL1 is drivably controlled in accordance with an input of the drive signal to the one-side end $5a$ of the coil 5.

The linear solenoid valve SL1 is provided in the hydraulic control device, and outputs a supplied hydraulic pressure as a control hydraulic pressure in accordance with the input drive signal. The linear solenoid valve SL1 is structured by the solenoid portion 1 and a pressure regulating valve portion (not illustrated). In the solenoid portion 1, the coil 5 is fitted to a radially outer side of a stator core (not illustrated), and a plunger 6 is arranged so as to face the distal end of the stator core. A shaft 7 integrally fixed to the plunger 6 is supported by the stator core (not illustrated). The shaft 7 abuts against a spool (not illustrated) of the pressure regulating valve portion through a central hole of the stator core. The solenoid portion 1 forms a magnetic circuit passing through the plunger 6 and the stator core based on a current flowing through the coil 5 by supplying the drive signal, and causes the plunger 6 and an attracting portion of the stator core to generate a magnetic attraction force in the plunger 6 in accordance with a value of the current flowing through the coil 5. Movement of the plunger 6 by the magnetic attraction force is transferred to the spool via the shaft 7, thereby operating the pressure regulating valve portion (not illustrated). Thus, a pressure to be output from an output port (not illustrated) is regulated linearly. A movable element formed of the shaft 7 and the plunger 6 reciprocally moves in a direction of an arrow X relative to the coil 5.

The drive device (ECU) 9 is connected to, for example, a shift lever (not illustrated) installed near a driver's seat of the vehicle (not illustrated). The drive device 9 includes the control section 16 and the plurality of control drive sections $9a_1$ to $9a_5$ (see FIG. 2) connected to the control section 16. That is, the drive device 9 includes, in addition to the control drive section $9a_1$ of FIG. 1 corresponding to the linear solenoid valve SL1, the control drive sections $9a_2$ to $9a_5$ as many as the other linear solenoid valves SL2 to SL5. The control section 16 drivably controls the linear solenoid valves SL1 to SL5 via the control drive sections $9a_1$ to $9a_5$, respectively.

As illustrated in FIG. 1, the control drive section $9a_1$ corresponding to the linear solenoid valve SL1 has a current path $48_1$ and a current path $49_1$ that are provided in series between the positive terminal (+) side of the battery VB and the ground gr1 brought into conduction to the negative terminal (−) side of the battery VB. Additionally, the control drive section $9a_1$ has a current path $50_1$ connected to a connection node 27 between the current path $48_1$ and the current path $49_1$.

The current path $50_1$ is provided with the connector Co and a resistor (shunt resistor) 25 having a one-side terminal $26a$ and an other-side terminal $26b$ connected between the connection node 27 and the connector Co. The connection node 27 is connected to a current detecting circuit $40_1$ via a wire $53_1$. Note that a first current path is structured by the current path $48_1$ and the current path $50_1$, a second current path is structured by the current path $49_1$ and the current path $50_1$, and a common current path for the first current path and the second current path is structured by the current path $50_1$. As a matter of course, those structures similarly apply to the other control drive sections $9a_2$ to $9a_5$.

In the control drive section $9a_1$, the current path $48_1$ is provided with a metal oxide semiconductor field effect transistor (MOSFET) $17_1$ (hereinafter referred to as a high-side MOSFET $17_1$) serving as a first switching element connected to the positive terminal side (+) of the battery VB. The current path $49_1$ is provided with a low-side MOSFET $19_1$ serving as a second switching element connected to the ground gr1 side brought into conduction to the negative terminal (−) side of the battery VB. The high-side MOSFET $17_1$ and the low-side MOSFET $19_1$ are structured by N-channel MOSFETs of identical conductivity types. Those MOSFETs are structured by power MOSFETs. The same applies to a MOSFET $18_1$ and a current detecting MOSFET $20_1$ described later. As a matter of course, those structures similarly apply to the control drive sections $9a_2$ to $9a_5$.

In the high-side MOSFET $17_1$, a gate G is connected to a PWM drive circuit $31_1$, a drain D that is a one-side end of the current path is connected to the positive terminal (+) side of the battery, and a source S that is an other-side end of the current path is connected to the connection node (connection portion) 27. In the low-side MOSFET $19_1$, a gate G is connected to a PWM drive circuit $32_1$, a source S that is a one-side end of the current path is connected to the ground gr1, and a drain D that is an other-side end of the current path is connected to the connection node 27.

The PWM drive circuits $31_1$ and $32_1$ each serving as a signal generation control section perform PWM control so that the drive signal is generated by supplying PWM signals (control signals) to the high-side MOSFET $17_1$ and the low-side MOSFET $19_1$ and switching conductive states and interrupted states of the current paths $48_1$ and $50_1$ between the positive terminal (+) side of the battery VB and the one-side end $5a$ of the coil 5 and the current paths $49_1$ and $50_1$ between the ground gr1 side and the one-side end $5a$ of the coil 5. As a matter of course, those structures similarly apply to the control drive sections $9a_2$ to $9a_5$.

In this embodiment, the high-side MOSFET $17_1$ mainly functions to control the current in order to supply the drive signal to the linear solenoid valve SL1, and the low-side MOSFET $19_1$ mainly functions to release energy accumulated in the linear solenoid valve SL1 when the high-side MOSFET $17_1$ is off. That is, the drive device 9 employs a synchronous rectification system, in which the high-side MOSFET $17_1$ turns on or off the input to control the amount of energy to be supplied to the linear solenoid valve SL1 and the low-side MOSFET $19_1$ performs a rectifying operation for supplying the energy of the linear solenoid valve SL1 to an output voltage different from the input.

The control drive section $9a_1$ of the drive device 9 includes the N-channel MOSFET $18_1$ and the N-channel current detecting MOSFET $20_1$ of conductivity types identical to those of the high-side MOSFET $17_1$ and the low-side MOSFET $19_1$. In the MOSFET $18_1$, a gate G is connected to the PWM drive circuit $31_1$, and a drain D that is a one-side end of the current path is connected between the high-side MOSFET $17_1$ of the current path $48_1$ and the positive terminal (+) of the battery. A source S that is an other-side end of the current path of the MOSFET $18_1$ is connected to the current detecting circuit $40_1$ described later. A reference symbol 51 of FIG. 1 represents a connection node that connects the gate G of each of the MOSFET 18$_1$ and the high-side MOSFET 17$_1$ to an output of the PWM drive circuit 31$_1$.

In the current detecting MOSFET 20$_1$, a gate G is connected to the PWM drive circuit 32$_1$, and a source S that is a one-side end of the current path is connected to the connection node (connection portion) 29 between the ground gr1 and the source S that is the one-side end of the current path of the low-side MOSFET 19$_1$ of the current path 49$_1$. A drain D that is an other-side end of the current path of the current detecting MOSFET 20$_1$ is connected to the current detecting circuit 40$_1$. A reference symbol 30 represents a connection node that connects the gate G of each of the current detecting MOSFET 20$_1$ and the low-side MOSFET 19$_1$ to an output of the PWM drive circuit 32$_1$. The high-side MOSFET 17$_1$, the low-side MOSFET 19$_1$, the MOSFET 18$_1$, and the current detecting MOSFET 20$_1$ provided in the control drive section 9$a_1$ are structured by enhancement type N-channel MOSFETs.

The control drive section 9$a_1$ includes the PWM drive circuits 31$_1$ and 32$_1$ described above, the current detecting circuit 40$_1$ described above, and a current detecting circuit 34$_1$, which are connected to the control section 16. The PWM drive circuit 31$_1$ supplies the PWM signal (see FIG. 3) as the control signal to the gate G of the high-side MOSFET 17$_1$ based on a command from the control section 16. The PWM drive circuit 32$_1$ supplies the PWM signal (see FIG. 3) as the control signal to the gate G of the low-side MOSFET 19$_1$ based on a command from the control section 16. As described above, the PWM drive circuits 31$_1$ and 32$_1$ each serving as the signal generation control section perform the PWM control so that the drive signal for the linear solenoid valve SL1 is generated by switching the conductive state and the interrupted state of the current path 48$_1$ and the current path 50$_1$ and the conductive state and the interrupted state of the current path 49$_1$ and the current path 50$_1$.

The gate G of the MOSFET 18$_1$ is connected to the PWM drive circuit 31$_1$ together with the gate G of the high-side MOSFET 17$_1$. Therefore, when the PWM drive circuit 31$_1$ applies, for example, a High (+) and then a Low (−) of the PWM signal to the gate G of the high-side MOSFET 17$_1$, the High (+) and then the Low (−) of the PWM signal are also applied to the gate G of the MOSFET 18$_1$. Thus, the MOSFET 18$_1$ operates at the same timing (same phase) as that of the high-side MOSFET 17$_1$. The gate G of the current detecting MOSFET 20$_1$ is connected to the PWM drive circuit 32$_1$ together with the gate G of the low-side MOSFET 19$_1$. Therefore, when the PWM drive circuit 32$_1$ applies, for example, a High (+) and then a Low (−) of the PWM signal to the gate G of the low-side MOSFET 19$_1$, the High (+) and then the Low (−) of the PWM signal are also applied to the gate G of the current detecting MOSFET 20$_1$. Thus, the current detecting MOSFET 20$_1$ operates at the same timing (same phase) as that of the low-side MOSFET 19$_1$. As a matter of course, those structures similarly apply to the control drive sections 9$a_2$ to 9$a_5$.

In the linear solenoid valve SL1, when the drive signal (current signal) supplied via the resistor 25, the connector Co, and the wire Ha is supplied to the coil 5 from the one-side end 5$a$, the coil 5 is excited in accordance with the current value of the drive signal, and the movable element structured by the shaft 7 and the plunger 6 is attracted to move leftward in FIG. 1. Thus, the spool (not illustrated) moves to a pressure regulating position together with the movable element, thereby regulating the pressure to be output from the output port (not illustrated). When the drive signal (current signal) flows from the connection node 27 to the resistor 25, a voltage drop occurs in the direction in which the current flows.

The current detecting circuit 34$_1$ detects the current value while differentially amplifying the voltage (voltage drop) generated at both ends of the resistor 25 when the drive signal is supplied to the coil 5 from each of the high-side MOSFET 17$_1$ and the low-side MOSFET 19$_1$. The current detecting circuit 34$_1$ then outputs the differentially amplified signal to the control section 16 via a notch filter (NF) 47$_1$. In the resistor 25 connected between the connector Co and the connection node 27 of the current path 50$_1$, the one-side terminal 26$a$ is connected to an inverting input terminal (−) 34$a$ of the current detecting circuit 34$_1$ structured by an operational amplifier, and the other-side terminal 26$b$ is connected to a non-inverting input terminal (+) 34$b$ of the current detecting circuit 34$_1$. The current detecting circuit 40$_1$ constantly monitors the current fed back via the current detecting MOSFET 20$_1$ when the drive signal is supplied to the linear solenoid valve SL1.

When a current flows through the current path 48$_1$, the current flows into the current detecting circuit 40$_1$ via the MOSFET 18$_1$ that operates at the same phase as that of the high-side MOSFET 17$_1$. Thus, the current detecting circuit 40$_1$ appropriately detects the current. When a current flows through the current path 49$_1$, the current flows into the ground gr1 via the low-side MOSFET 19$_1$, and the current detecting MOSFET 20$_1$ operates at the same phase as that of the low-side MOSFET 19$_1$. Therefore, the current flowing through the current detecting circuit 40$_1$ via the connection node 27 and the wire 53$_1$ flows into the ground gr1 from the connection node 29 via the current detecting MOSFET 20$_1$. Thus, the current detecting circuit 40$_1$ appropriately detects the current flowing through the current path 49$_1$.

The current detecting circuit 34$_1$ is structured by the operational amplifier, and is capable of detecting a current flowing through the coil 5 via the current path 50$_1$ serving as the common current path. The current detecting circuit 34$_1$ may structure a current monitoring section that monitors a current flowing through the current paths 49$_1$ and 50$_1$ when the PWM drive circuits 31$_1$ and 32$_1$ perform the PWM control. In the current path 50$_1$ that is the common current path for the first and second current paths described above, the resistor 25 is connected in series. As a matter of course, the structures described above similarly apply to the control drive sections 9$a_2$ to 9$a_5$.

The control section 16 performs feedback control so that appropriate PWM signals are output from the PWM drive circuits 31$_1$ and 32$_1$ by using, as feedback currents, currents that flow through the current paths (common current paths) 50$_1$ and 50$_2$ in response to the outputs for the drive signals from the PWM drive circuits 31$_1$ and 32$_1$ and are monitored by the current detecting circuits (current monitoring sections) 40$_1$ and 40$_2$. The control section 16 compares command values for the drive signals, which are output from the PWM drive circuits 31$_1$ and 32$_1$ and the PWM drive circuits 31$_2$ and 32$_2$ corresponding to two of the linear solenoid valves SL1 to SL5 (for example, SL1 and SL2), with the currents that flow through the current paths (common current paths) 50$_1$ and 50$_2$ and are monitored by the current detecting circuits (current monitoring sections) 40$_1$ and 40$_2$ after the drive signals are output, and determines that disconnection abnormality occurs when the currents in the current paths 50$_1$ and 50$_2$ are smaller than those of the command values. As described above, the current detecting circuits 34$_1$ and 34$_2$ may be used as the current monitoring sections. Note that the two of the linear solenoid valves SL1 to SL5 mean linear solenoid valves to be operated through the PWM control so that the engagement elements such as clutches and brakes (not illustrated) are simultaneously engaged through the respective operations.

In the structure described above, the linear solenoid valves SL1 to SL5 are provided, and the shifting is always performed by simultaneously engaging the clutches and brakes through the operations of a plurality of (for example, two or more) linear solenoid valves. Therefore, if the disconnection abnormality occurs in the single common wire 57, for example, it is conceivable that the high-side MOSFET $17_1$ of the control drive section $9a_1$ corresponding to the linear solenoid valve SL1 is turned on, and the drive current flowing through the corresponding coil 5 cannot flow into the ground gr1 via the common wire 57 but flows, for example, via the wires 56 and the corresponding coil 5 toward the low-side MOSFET $19_2$ of the control drive section $9a_2$ corresponding to the linear solenoid valve SL2 (FIG. 2) that operates so as to simultaneously engage the clutch or brake.

When the command value of the PWM signal generated by the PWM drive circuit $31_1$ corresponding to the linear solenoid valve SL1 is, for example, 1 [A] and the command value of the PWM signal generated by the PWM drive circuit $32_2$ corresponding to the linear solenoid valve SL2 is, for example, 0.1 [A], the current monitored by the current detecting circuit $40_1$ is smaller than that of the command value of 1 [A] on the one linear solenoid valve SL1 side. Therefore, the control section 16 makes a determination on the current (feedback current) on the other linear solenoid valve SL2 side while recognizing this condition. In this determination, when the current monitored by the current detecting circuit $40_2$ is smaller than that of the command value of 0.1 [A] on the linear solenoid valve SL2 side, the control section 16 determines this condition as a condition that the disconnection abnormality occurs.

This phenomenon is not limited to the case of the linear solenoid valves SL1 and SL2, and the determination is similarly made on the other combinations of the linear solenoid valves SL1 to SL5 that operate so as to simultaneously engage the clutches or brakes. When currents smaller than those of the command values output from the PWM drive circuits 31 and 32 are detected through the monitoring performed by the current detecting circuits 40 similarly to the above, the control section 16 determines that the disconnection abnormality occurs. In this case, however, when a current smaller than that of the command value is detected on one of the linear solenoid valves that operate so as to achieve simultaneous engagement but is not detected on the other, the control section 16 determines that an abnormality other than the disconnection of the common wire 57 occurs as described later.

Figure 4:
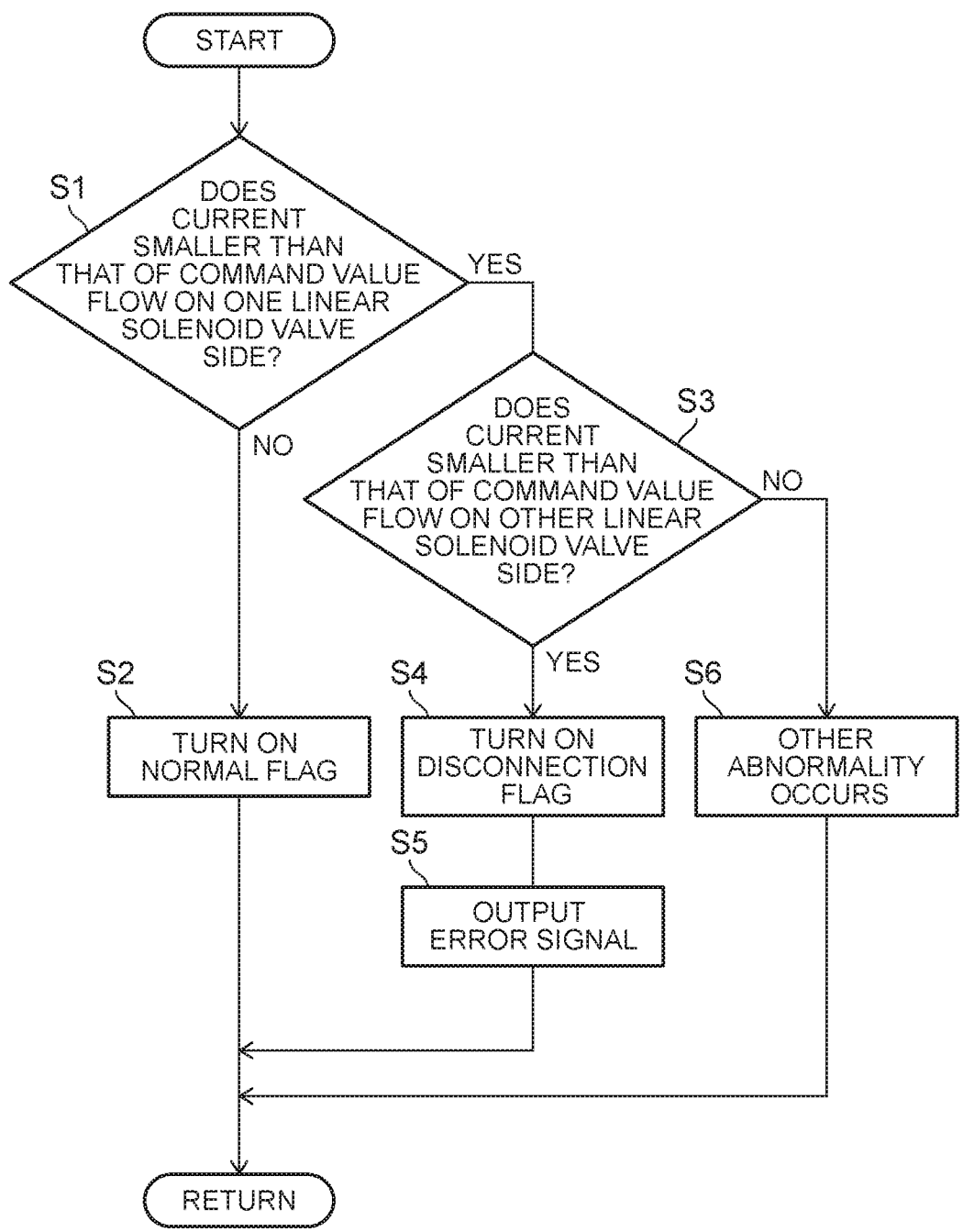
FIG. 4 is a flowchart illustrating disconnection determining processing according to the first embodiment.

The drive device 9 according to this embodiment operates as follows. FIG. 4 is a flowchart illustrating the disconnection determining processing according to this embodiment.

That is, in this embodiment, the drive device 9 operates as follows under a normal condition that the disconnection abnormality does not occur in the common wire 57. For example, when the shift lever (not illustrated) is operated and a shift range is switched to, for example, a D-range (drive range), the high-side MOSFET 17 and the low-side MOSFET 19 are alternately turned on by the PWM drive circuits 31 and 32 in each control drive section 9a based on commands from the control section 16.

That is, when the PWM drive circuits 31 and 32 are driven under the control by the control section 16, the ratio between a High ("1") and a Low ("0") of a pulse signal (PWM signal) having a constant period is set variable to change the duty ratio (ratio of on time) of the pulse. Feedback control is performed while variably controlling an average output within an elapsed time. Thus, the solenoid portions 1 of, for example, the linear solenoid valves SL1 and SL2 are driven linearly.

Figure 3:
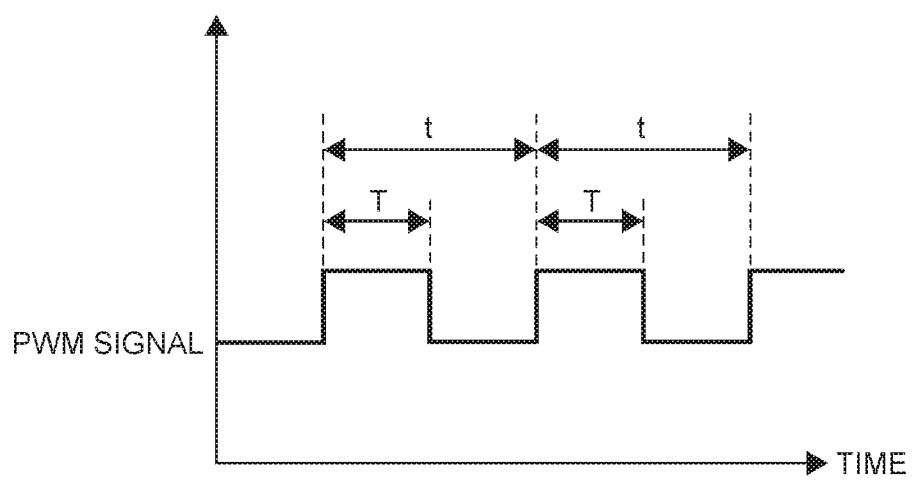
FIG. 3 is a diagram simply illustrating a PWM signal to be used in PWM control.

At this time, the PWM drive circuits 31 and 32 supply PWM signals each having a PWM pulse width T (that is, a High pulse width) within a constant period t as illustrated in FIG. 3 to the gates G of the high-side MOSFET 17 and the low-side MOSFET 19 via the connection nodes 51 and 30, respectively. By applying the PWM signals to the respective gates G, the high-side MOSFET 17 operates so as to be turned on when the pulse of the PWM signal is High (+) and to be turned off when the pulse of the PWM signal is Low (−). In response to a PWM signal having a phase shifted from that of the PWM signal for the high-side MOSFET 17, the low-side MOSFET 19 operates so as to be turned on when the pulse of the PWM signal is High (+) and to be turned off when the pulse of the PWM signal is Low (−).

Accordingly, a drive signal (current signal) corresponding to the PWM signal is supplied to the one-side end 5a of the coil 5 of the solenoid portion 1 via the current path 50 and the wire Ha through the current path between the drain and the source of the high-side MOSFET 17 or through the current path between the source and the drain of the low-side MOSFET 19. Thus, for example, the linear solenoid valves SL1 and SL2 are operated so as to simultaneously engage the clutches or brakes. Therefore, when the disconnection abnormality or the like does not occur, the spools of the linear solenoid valves SL1 and SL2 are driven linearly.

During the operations described above, the control section 16 constantly monitors the disconnection abnormality of the single common wire 57 via the current detecting circuits $40_1$ and $40_2$.

That is, the control section 16 executes the disconnection determining processing for determining that the disconnection abnormality occurs in the common wire 57 based on current changes of the feedback currents monitored by the current detecting circuits $40_1$ and $40_2$ of the control drive sections $9a_1$ and $9a_2$. First, among the control drive sections $9a_1$ to $9a_5$, for example, in the control drive sections $9a_1$ and $9a_2$ corresponding to the linear solenoid valves SL1 and SL2 that are driven so as to simultaneously engage the clutches or brakes, the command values from the PWM drive circuits $31_2$ and $32_2$ for current outputting are compared with currents (feedback currents) that flow through the current paths $50_1$ and $50_2$ and are monitored by the current detecting circuits $40_1$ and $40_2$. In Step S1, the control section 16 determines whether a current smaller than that of the command value flows through the current path $50_1$ on the one linear solenoid valve SL1 side.

For example, in a state in which the common wire 57 is disconnected, when the high-side MOSFET $17_1$ of the control drive section $9a_1$ is turned on and a drive signal is input from the current path $50_1$ to the coil 5 of the linear solenoid valve SL1 and also input from the connection portion 60 to the coil 5 of the linear solenoid valve SL2 via the wires 56 to flow through the current path (common current path) $50_2$ of the control drive section $9a_2$, the resistance value increases by an amount at least corresponding to the coil of the linear solenoid valve SL2 as compared with a case where the common wire 57 is not disconnected. Therefore, a feedback current smaller than that of the command value of, for example, the PWM drive circuit $31_1$ is detected by the current detecting circuit $40_1$. This phenomenon is similar to a case where a drive signal is output from the high-side MOSFET $17_2$ on the control drive section $9a_2$ side. A feedback current smaller than that of the command value of the PWM drive circuit $31_2$ is detected by the current detecting circuit $40_2$.

Thus, in Step S1, the control section 16 determines whether a current (feedback current) smaller than that of the command value of PWM control, which is generated by commanding, for example, the PWM drive circuit $31_1$, flows through the current path $50_1$. As a result, when the control section 16 determines that such a current does not flow through the current path $50_1$, the control section 16 turns on a normal flag in Step S2, and continues shifting processing while determining that the disconnection abnormality does not occur in the common wire 57.

When the control section 16 determines in Step S1 that a current smaller than that of the command value flows through the current path $50_1$, the control section 16 determines in Step S3 whether a current smaller than that of the command value flows through the current path $50_2$ on the other linear solenoid valve SL2 side. As a result, when the control section 16 determines that a current smaller than that of the command value also flows through the current path $50_2$ on the other linear solenoid valve SL2 side, the control section 16 proceeds to Step S4. In Step S4, the control section 16 turns on a disconnection flag to determine that the disconnection abnormality occurs, and the control section 16 proceeds to Step S5 to output an error signal. When the control section 16 outputs the error signal, the control section 16 immediately stops the PWM control performed by the PWM drive circuits $31_1$ and $32_1$, and interrupts all the engaging operations for the clutches and brakes by all the linear solenoid valves SL1 to SL5 including the linear solenoid valves SL1 and SL2. The control section 16 alerts the driver by, for example, providing an indication using a lamp or the like on an indication panel arranged at the driver's seat (not illustrated).

When the control section 16 determines in Step S3 that a current smaller than that of the command value does not flow through the current path $50_2$ on the other linear solenoid valve SL2 side, the control section 16 determines in Step S6 that another abnormality occurs. That is, when a feedback current smaller than that of the command value is detected on one of the linear solenoid valves that operate so as to simultaneously engage the clutches and brakes but is not detected on the other, the control section 16 determines that an abnormality other than the disconnection of the common wire 57 (abnormality caused by another factor) occurs.

As described above, in this embodiment, when the disconnection abnormality occurs in the single common wire 57 that integrally grounds all the linear solenoid valves SL1 to SL5 to the ground gr1, the control section 16 determines that currents smaller than those of the command values of PWM control, which are generated by commanding the PWM drive circuits 31 and 32, flow through the current paths (common current paths) 50. In this manner, the control section 16 can promptly determine that the disconnection abnormality occurs. At this timing, the control drive sections $9a_1$ to $9a_5$ are controlled by the control section 16 so as not to output PWM signals from any of the PWM drive circuits $31_1$ to $31_5$ and $32_1$ to $32_5$. Therefore, all of the high-side MOSFETs $17_1$ to $17_5$ and the low-side MOSFETs $19_1$ to $19_5$ are brought into an off state, so that the respective current paths are interrupted (off state). Thus, none of the linear solenoid valves SL1 to SL5 can operate.

Second Embodiment

Figure 5:
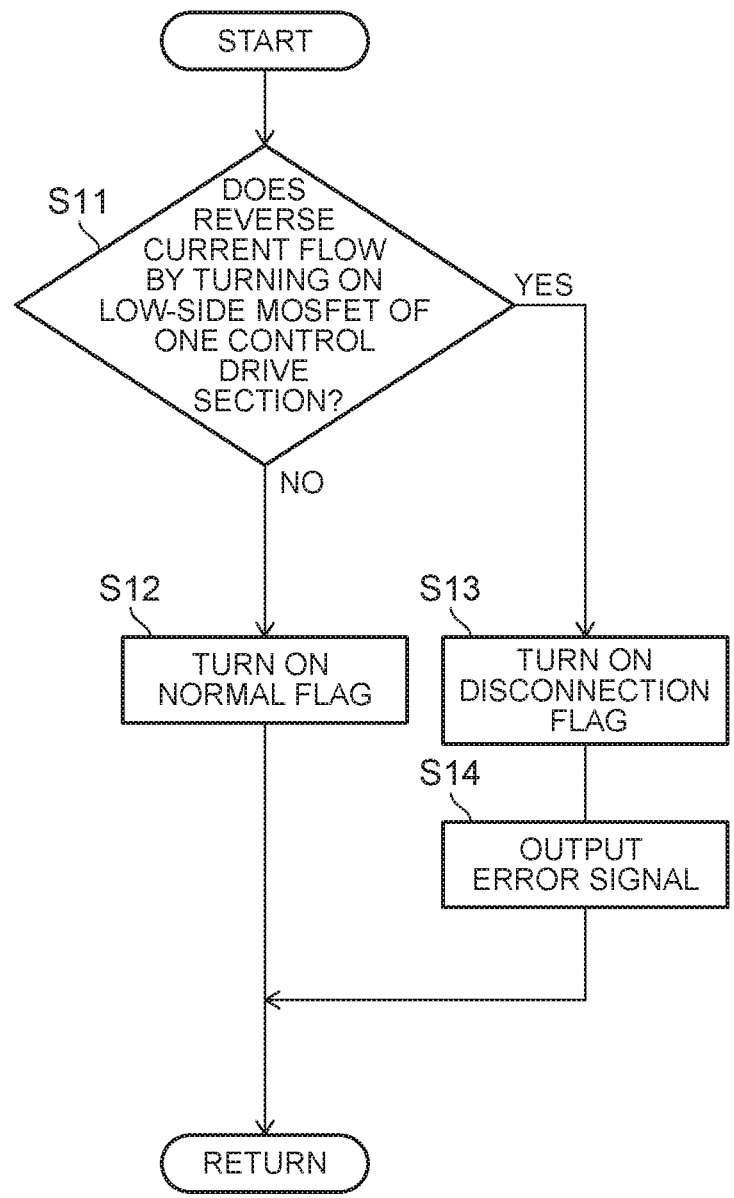
FIG. 5 is a flowchart illustrating disconnection determining processing according to a second embodiment.

Next, a second embodiment is described with reference to FIG. 2 and FIG. 5. FIG. 5 is a flowchart illustrating disconnection determining processing according to this embodiment. All the components illustrated in FIG. 1 and FIG. 2 are similar in this embodiment, but the current detecting circuits $34_1$ to $34_5$ that are used only as the current monitoring sections for the currents flowing through the current paths (common current paths) $50_1$ to $50_5$ in the first embodiment are used also as current direction detecting sections that detect directions of currents flowing between both the terminals of the resistors 25 of the current paths $50_1$ to $50_5$.

That is, in this embodiment, the control drive sections $9a_1$ to $9a_5$ of FIG. 2 include the current detecting circuits $34_1$ to $34_5$ serving as the current direction detecting sections that detect directions of currents flowing through the current paths (common current paths) $50_1$ to $50_5$, respectively. The control section 16 determines that the disconnection abnormality occurs when the current detecting circuits $34_1$ to $34_5$ detect currents flowing in directions reverse to those of the commands for the drive signals.

If the disconnection abnormality occurs in the common wire 57, for example, it is conceivable that, when the low-side MOSFET $19_2$ of the control drive section $9a_2$ corresponding to the linear solenoid valve SL2 is turned on at a timing at which the high-side MOSFET $17_1$ of the control drive section $9a_1$ corresponding to the linear solenoid valve SL1 is turned on, the high-side MOSFET $17_1$ is turned on and a drive current flowing through the corresponding coil 5 cannot flow into the ground gr1 via the common wire 57, and therefore flows via the wires 56 and the corresponding coil 5 toward the low-side MOSFET $19_2$ of the control drive section $9a_2$ that operates so as to simultaneously engage the clutch or the like.

When the command value of the PWM signal generated by the PWM drive circuit $31_1$ corresponding to the linear solenoid valve SL1 is, for example, 1 [A] and the command value of the PWM signal generated by the PWM drive circuit $31_2$ corresponding to the linear solenoid valve SL2 is, for example, 0.1 [A], the current monitored by the current detecting circuit $40_1$ (or the current detecting circuit $34_1$) is smaller than that of the command value of 1 [A] on the linear solenoid valve SL1 side. Moreover, the current monitored by the current detecting circuit $40_2$ is smaller than that of the command value of 0.1 [A] on the linear solenoid valve SL2 side, and the current flowing in a direction reverse to that of the command for the drive signal is detected by the current detecting circuit $40_2$. Thus, the control section 16 determines this condition as a condition that the disconnection abnormality occurs.

That is, in Step S11, the control section 16 determines whether a reverse current flows through, for example, the current path (common current path) $50_2$ by turning on the low-side MOSFET $19_2$ by one of the two PWM drive circuits ($32_2$) that are driven so as to simultaneously engage the clutches or the like. As a result, when the control section 16 determines that a reverse current does not flow through the current path $50_2$, the control section 16 turns on a normal flag in Step S12, and continues the shifting processing while determining that the disconnection abnormality does not occur in the common wire 57.

When the control section 16 determines in Step S11 that a reverse current flows through the current path $50_2$, the control section 16 turns on a disconnection flag in Step S13 to determine that the disconnection abnormality occurs. The control section 16 then proceeds to Step S14 to output an error signal. When the control section 16 outputs the error signal, the control section 16 immediately stops the PWM control performed by the PWM drive circuits $31_1$ and $32_1$, and interrupts all the engaging operations for the clutches and brakes by all the linear solenoid valves SL1 to SL5 including the linear solenoid valves SL1 and SL2. The control section 16 alerts the driver by providing an indication using the lamp or the like on the indication panel (not illustrated).

According to this embodiment described above, the control section 16 can determine that the disconnection abnormality occurs in the common wire 57 when currents flowing in directions reverse to those of the commands for the drive signals are detected by the current detecting circuits 34 based on the timings of the commands of the PWM signals to the low-side MOSFETs 19 of the plurality of control drive sections $9a_1$ to $9a_5$, respectively. In this embodiment as well, effects similar to those of the first embodiment can be attained.

Note that the disconnection determination based on the magnitudes of feedback currents using the current detecting circuits $40_1$ to $40_5$ according to the first embodiment described above (see FIG. 4) may be combined with the disconnection determination based on the reverse current detection using the current detecting circuits $34_1$ to $34_5$ according to the second embodiment (see FIG. 5). Accordingly, it can be detected more accurately that the disconnection abnormality occurs in the common wire 57.

This embodiment is structured such that the current detecting circuits $34_1$ to $34_5$ detect reverse currents flowing through the current paths (common current paths) $50_1$ to $50_5$. For example, this embodiment may be structured such that, when the current detecting circuits $40_1$ to $40_5$ detect via the current detecting MOSFETs $20_1$ to $20_5$ that currents that are not supposed to flow at the currently operating timings flow through the low-side MOSFETs $19_1$ to $19_5$ of the control drive sections $9a_1$ to $9a_5$, respectively, it is determined that the abnormality occurs due to generation of reverse currents.

In the first and second embodiments, in the control drive sections $9a_1$ to $9a_5$, the other-side ends 5b of the linear solenoid valves SL1 to SL5 are connected to the negative terminal (ground terminal gt) side of the battery VB on a downstream side in the direction in which the drive signal is supplied. However, the first and second embodiments are not limited to this structure. That is, the first and second embodiments may be structured such that the other-side ends 5b of the linear solenoid valves SL1 to SL5 are connected to the positive terminal (+) side of the battery VB on the downstream side in the direction in which the drive signal is supplied.

[Summary of Embodiments]

As described above, a drive device (9) according to the embodiments controls a plurality of inductive loads (SL1 to SL5) each having a one-side end (5a) and an other-side end (5b), is drivably controlled in accordance with an input of the drive signal, and is connected at the other-side end (5b) to one terminal out of a positive terminal and a negative terminal of a battery (VB).

The drive device (9) includes a connection portion (Co) that connects a plurality of wires (Ha) each connected to the one-side end (5a) of a corresponding one of the plurality of inductive loads (SL1 to SL5), and a common wire (57) that integrally commonalizes two or more of a plurality of wires (56) each connected to the other-side end (5b) of a corresponding one of the plurality of inductive loads (SL1 to SL5).

Thus, the drive device 9 is structured such that the plurality of wires 56 connected to the other-side ends 5b of the plurality of linear solenoid valves SL1 to SL5, respectively, are connected to the connector Co that is the connection portion by the common wire 57 that integrally commonalizes two or more of the wires 56. Therefore, the number of the ground terminals gt of the connector Co can be reduced, whereby the connector Co can be downsized. The plurality of wires 56 can be simplified as compared with a case where the wires 56 are directly connected to the drive device 9. Therefore, for example, the wires can be routed satisfactorily in an oil pan (not illustrated) that houses the hydraulic control device 103, and a wire connecting operation to be performed when the automatic transmission 100 is manufactured can be simplified.

The drive device (9) according to the embodiments includes:
  a control section (16); and
  a plurality of control drive sections ($9a_1$ to $9a_5$) each connected to the control section (16) and to the one-side end of a corresponding one of the plurality of inductive loads.

Each of the plurality of control drive sections ($9a_1$ to $9a_5$) includes:
  a first switching element ($17_1$ to $17_5$) conductively connected to a positive terminal side of the battery;
  a second switching element ($19_1$ to $19_5$) connected to a negative terminal side of the battery;
  a signal generation control section ($31_1$ to $31_5$, $32_1$ to $32_5$) that performs control so that the drive signal is generated by supplying a control signal to each of the first switching element and the second switching element and switching a conductive state and an interrupted state of each of a first current path ($48_1$ to $48_5$, $50_1$ to $50_5$) between the one-side end (5a) of the inductive load and the positive terminal side of the battery and a second current path ($49_1$ to $49_5$, $50_1$ to $50_5$) between the one-side end (5a) of the inductive load and the negative terminal side of the battery; and
  a current monitoring section ($34_1$ to $34_5$, $40_1$ to $40_5$) that monitors a current flowing through a common current path ($50_1$ to $50_5$) common to the first current path ($48_1$ to $48_5$, $50_1$ to $50_5$) and the second current path ($49_1$ to $49_5$, $50_1$ to $50_5$) during the control performed by the signal generation control section ($31_1$ to $31_5$, $32_1$ to $32_5$).

The control section (16) executes disconnection determining processing (S4, S13) for determining that a disconnection abnormality occurs in the common wire (57) based on a change of the current in the common current path ($50_1$ to $50_5$), which is monitored by the current monitoring section ($34_1$ to $34_5$, $40_1$ to $40_5$) of each of the control drive sections ($9a_1$ to $9a_5$).

Thus, in the case of the structure in which the coils 5 of the plurality of linear solenoid valves SL1 to SL5 are connected to the ground terminal gt on the drive device side while being integrated by the common wire 57, when the common wire 57 is disconnected, it can be determined promptly that the disconnection abnormality occurs.

In the drive device (9) according to the embodiments, the one terminal is the negative terminal (gr1 , gt).

Thus, all the other-side ends 5b of the coils 5 of the linear solenoid valves SL1 to SL5 can be connected to the ground terminal gt (ground gr1 ) while being integrated by the single common wire 57. Accordingly, the operating voltage range can be obtained sufficiently.

In the drive device (9) according to the embodiments, the control section (16) compares command values for the drive signals, which are output from the signal generation control sections (for example, $31_1$, $32_1$) corresponding to at least two (for example, SL1, SL2) of the plurality of inductive loads (SL1 to SL5), with the currents that flow through the common current paths ($50_1$, $50_2$) and are monitored by the current monitoring sections ($40_1$, $40_2$) after the drive signals are output, and determines that the disconnection abnormality occurs when the currents in the common current paths are smaller than the command values.

Thus, it can be determined promptly and securely that the disconnection abnormality occurs in the common wire 57 by comparing the command values for the currents, which are output through the PWM control, with the currents monitored by the current detecting circuits 40.

In the drive device (9) according to the embodiments, each of the plurality of control drive sections ($9a_1$ to $9a_5$) includes a current direction detecting section ($34_1$ to $34_5$) that detects a direction of a current flowing through the common current path ($50_1$ to $50_5$).

The control section (16) determines that the disconnection abnormality occurs when a current flowing in a direction reverse to a direction of a command for the drive signal is detected by the current direction detecting section ($34_1$ to $34_5$).

Thus, it can be determined promptly and securely that the disconnection abnormality occurs in the common wire 57 when a current flowing in a direction reverse to that of the command for the drive signal is detected by the current detecting circuit 34 based on the timing of the command of the PWM signal to the low-side MOSFET 19.

In the drive device (9) according to the embodiments, the first switching element and the second switching element are structured by a high-side MOSFET ($17_1$ to $17_5$) and a low-side MOSFET ($19_1$ to $19_5$) of identical conductivity types.

Each of the plurality of control drive sections ($9a_1$ to $9a_5$) includes a current detecting MOSFET ($20_1$ to $20_5$) of the conductivity type identical to those of the high-side MOSFET ($17_1$ to $17_5$) and the low-side MOSFET ($19_1$ to $19_5$).

A gate (G) of the high-side MOSFET ($17_1$ to $17_5$) is connected to the signal generation control section (corresponding one of $31_1$ to $31_5$), and a one-side end (D) of a current path is connected to the positive terminal side of the battery.

A gate (G) of the low-side MOSFET ($19_1$ to $19_5$) is connected to the signal generation control section (corresponding one of $32_1$ to $32_5$), and a one-side end (S) of a current path is connected to the negative terminal (gr1) side of the battery.

A gate (G) of the current detecting MOSFET ($20_1$ to $20_5$) is connected to the signal generation control section (corresponding one of $32_1$ to $32_5$), a one-side end (S) of a current path is connected between an one-side end (S) of the second current path of the second switching element (corresponding one of $19_1$ to $19_5$) and the negative terminal (gr1) side, and an other-side end (D) of the current path is connected to the current monitoring section (corresponding one of $40_1$ to $40_5$).

Thus, for example, the linear solenoid valve SL1 can drivably be controlled appropriately via the high-side MOSFET 17 and the low-side MOSFET 19. Moreover, the control section 16 can determine promptly and securely that the disconnection abnormality occurs in the common wire 57 by receiving a signal from the current detecting circuit 40 via the current detecting MOSFET 20 connected to the low-side MOSFET 19.

Possibilities of Other Embodiments

In the embodiments described above, the drive device 9 using the N-channel MOSFETs as the switching elements is described as an example, but is not limited to this example. For example, a drive device using P-channel MOSFETs may be employed. As the switching element, a bipolar transistor may be used in place of the MOSFET. Furthermore, another switching element that mechanically performs a switching operation may be used.

The embodiments described above are directed to the drive device 9 that can be used as the vehicle transmission device using the linear solenoid valves. For example, there may be employed a drive device as a hybrid-vehicle transmission device having a motor-generator mounted in place of the torque converter and using the linear solenoid valves. Furthermore, there may be employed a drive device as an electric-vehicle transmission device that causes an electric motor to drive the vehicle.

INDUSTRIAL APPLICABILITY

The drive device can be used for a device that electrically controls a solenoid valve that controls a hydraulic pressure. In particular, the drive device is suited to use for a device that is required for downsizing of a connection portion of the drive device.

DESCRIPTION OF THE REFERENCE NUMERALS $5a$ . . . one-side end of inductive load (one-side end of linear solenoid valve)
$5b$ . . . other-side end of inductive load (other-side end of linear solenoid valve)
9 . . . drive device
$9a_1$ to $9a_5$ . . . control drive section
16 . . . control section
$17_1$ to $17_5$ . . . first switching element (high-side MOSFET)
$19_1$ to $19_5$ . . . second switching element (low-side MOSFET)
$20_1$ to $20_5$ . . . current detecting MOSFET
$31_1$ to $31_5$, $32_1$ to $32_5$ . . . signal generation control section (PWM drive circuit)
$34_1$ to $34_5$ . . . current monitoring section, current direction detecting section (current detecting circuit)
$40_1$ to $40_5$ . . . current monitoring section (current detecting circuit)
$48_1$ to $48_5$, $49_1$ to $49_5$, $50_1$ to $50_5$ . . . first current path, second current path, common current path (current path)
57 . . . common wire
Co . . . connection portion (connector)
D . . . one-side end of current path
G . . . gate
gr1, gt . . . other terminal, negative terminal (ground, ground terminal)
S . . . one-side end of current path
S4, 13 . . . disconnection determining processing
SL1 to SL5 . . . inductive load (linear solenoid valve)
VB . . . battery

The invention claimed is:
1. A drive device that controls a plurality of inductive loads each having a one-side end and an other-side end, is drivably controlled in accordance with an input of a drive signal, and is connected at the other-side end to one terminal out of a positive terminal and a negative terminal of a battery,
the drive device comprising:

a connection portion that connects a plurality of wires each connected to the one-side end of a corresponding one of the plurality of inductive loads, a common wire that integrally commonalizes two or more of a plurality of wires each connected to the other-side end of a corresponding one of the plurality of inductive loads, a control section, and a plurality of control drive sections each connected to the control section and to the one-side end of a corresponding one of the plurality of inductive loads, wherein each of the plurality of control drive sections includes:
   a first switching element conductively connected to a positive terminal side of the battery;
   a second switching element connected to a negative terminal side of the battery;
   a signal generation control section that performs control so that the drive signal is generated by supplying a control signal to each of the first switching element and the second switching element and switching a conductive state and an interrupted state of each of a first current path between the one-side end of the inductive load and the positive terminal side of the battery and a second current path between the one-side end of the inductive load and the negative terminal side of the battery, and
   a current monitoring section that monitors a current flowing through a common current path common to the first current path and the second current path during control performed by the signal generation control section, wherein the control section executes disconnection determining processing for determining that a disconnection abnormality occurs in the common wire based on a change of the current in the common current path, which is monitored by the current monitoring section of each of the control drive sections.

2. The drive device according to claim 1, wherein the one terminal is the negative terminal.

3. The drive device according to claim 1, wherein the control section compares command values for the drive signals, which are output from the signal generation control sections corresponding to at least two of the plurality of inductive loads, with the currents that flow through the common current paths and are monitored by the current monitoring sections after the drive signals are output, and determines that the disconnection abnormality occurs when the currents in the common current paths are smaller than the command values.

4. The drive device according to claim 2, wherein the control section compares command values for the drive signals, which are output from the signal generation control sections corresponding to at least two of the plurality of inductive loads, with the currents that flow through the common current paths and are monitored by the current monitoring sections after the drive signals are output, and determines that the disconnection abnormality occurs when the currents in the common current paths are smaller than the command values.

5. The drive device according to claim 1, wherein each of the plurality of control drive sections includes a current direction detecting section that detects a direction of a current flowing through the common current path, and the control section determines that the disconnection abnormality occurs when a current flowing in a direction reverse to a direction of a command for the drive signal is detected by the current direction detecting section.

6. The drive device according to claim 2, wherein each of the plurality of control drive sections includes a current direction detecting section that detects a direction of a current flowing through the common current path, and the control section determines that the disconnection abnormality occurs when a current flowing in a direction reverse to a direction of a command for the drive signal is detected by the current direction detecting section.

7. The drive device according to claim 3, wherein each of the plurality of control drive sections includes a current direction detecting section that detects a direction of a current flowing through the common current path, and the control section determines that the disconnection abnormality occurs when a current flowing in a direction reverse to a direction of a command for the drive signal is detected by the current direction detecting section.

8. The drive device according to claim 4, wherein each of the plurality of control drive sections includes a current direction detecting section that detects a direction of a current flowing through the common current path, and the control section determines that the disconnection abnormality occurs when a current flowing in a direction reverse to a direction of a command for the drive signal is detected by the current direction detecting section.

9. The drive device according to claim 1, wherein the first switching element and the second switching element are structured by a high-side MOSFET and a low-side MOSFET of identical conductivity types, each of the plurality of control drive sections includes a current detecting MOSFET of a conductivity type identical to the conductivity types of the high-side MOSFET and the low-side MOSFET, a gate of the high-side MOSFET is connected to the signal generation control section, and a one-side end of a current path is connected to the positive terminal side of the battery, a gate of the low-side MOSFET is connected to the signal generation control section, and a one-side end of a current path is connected to the negative terminal side of the battery, and a gate of the current detecting MOSFET is connected to the signal generation control section, a one-side end of a current path is connected between one-side end of the second current path of the second switching element and the negative terminal side, and an other-side end of the current path is connected to the current monitoring section.

10. The drive device according to claim 2, wherein the first switching element and the second switching element are structured by a high-side MOSFET and a low-side MOSFET of identical conductivity types, each of the plurality of control drive sections includes a current detecting MOSFET of a conductivity type identical to the conductivity types of the high-side MOSFET and the low-side MOSFET, a gate of the high-side MOSFET is connected to the signal generation control section, and a one-side end of a current path is connected to the positive terminal side of the battery, a gate of the low-side MOSFET is connected to the signal generation control section, and a one-side end of a current path is connected to the negative terminal side of the battery, and a gate of the current detecting MOSFET is connected to the signal generation control section, a one-side end of a current path is connected between one-side end of the second current path of the second switching element and the negative terminal side, and an other-side end of the current path is connected to the current monitoring section.

11. The drive device according to claim 3, wherein the first switching element and the second switching element are structured by a high-side MOSFET and a low-side MOSFET of identical conductivity types, each of the plurality of control drive sections includes a current detecting MOSFET of a conductivity type identical to the conductivity types of the high-side MOSFET and the low-side MOSFET, a gate of the high-side MOSFET is connected to the signal generation control section, and a one-side end of a current path is connected to the positive terminal side of the battery, a gate of the low-side MOSFET is connected to the signal generation control section, and a one-side end of a current path is connected to the negative terminal side of the battery, and a gate of the current detecting MOSFET is connected to the signal generation control section, a one-side end of a current path is connected between one-side end of the second current path of the second switching element and the negative terminal side, and an other-side end of the current path is connected to the current monitoring section.

12. The drive device according to claim 5, wherein the first switching element and the second switching element are structured by a high-side MOSFET and a low-side MOSFET of identical conductivity types, each of the plurality of control drive sections includes a current detecting MOSFET of a conductivity type identical to the conductivity types of the high-side MOSFET and the low-side MOSFET, a gate of the high-side MOSFET is connected to the signal generation control section, and a one-side end of a current path is connected to the positive terminal side of the battery, a gate of the low-side MOSFET is connected to the signal generation control section, and a one-side end of a current path is connected to the negative terminal side of the battery, and a gate of the current detecting MOSFET is connected to the signal generation control section, a one-side end of a current path is connected between one-side end of the second current path of the second switching element and the negative terminal side, and an other-side end of the current path is connected to the current monitoring section.

\* \* \* \* \*